United States Patent [19]

Baird

[11] Patent Number: 4,615,857
[45] Date of Patent: Oct. 7, 1986

[54] ENCAPSULATION MEANS AND METHOD FOR REDUCING FLASH

[75] Inventor: John Baird, Scottsdale, Ariz.

[73] Assignee: Motorola, Inc., Schaumburg, Ill.

[21] Appl. No.: 676,759

[22] Filed: Nov. 30, 1984

[51] Int. Cl.[4] .................. B29C 33/20; B29C 39/10
[52] U.S. Cl. ........................... 264/272.17; 29/407; 100/258 A; 264/219; 264/276; 425/116; 425/121; 425/125; 425/408
[58] Field of Search .................. 264/276, 219, 272.17; 425/406, 411, 121, 116, 125, 408; 100/258 A, 258 R; 29/588, 407

[56] References Cited

U.S. PATENT DOCUMENTS

| | | |
|---|---|---|
| Re. 30,977 | 6/1982 | Zecher . |
| 1,466,730 | 9/1923 | Sanford .................. 425/406 |
| 3,640,660 | 2/1972 | De Mets .................. 425/411 |
| 3,881,852 | 5/1975 | Ahrweiler .................. 425/406 |
| 3,950,119 | 4/1976 | Reichenbach . |
| 3,972,663 | 8/1976 | Taniguchi . |
| 4,025,268 | 5/1977 | Taylor .................. 425/411 |
| 4,053,276 | 10/1977 | Ahrweiler et al. .................. 425/406 |
| 4,231,730 | 11/1980 | Birt .................. 425/411 |
| 4,248,582 | 2/1981 | Martin, Jr. . |
| 4,305,897 | 12/1981 | Hazamn et al. . |
| 4,310,112 | 1/1982 | Huff . |
| 4,334,849 | 6/1982 | Boch . |
| 4,460,537 | 7/1984 | Heinle .................. 29/588 |
| 4,466,266 | 8/1984 | Gardner et al. . |
| 4,479,630 | 10/1984 | Werneche . |

FOREIGN PATENT DOCUMENTS 2402931 7/1974 Fed. Rep. of Germany ...... 425/406

Primary Examiner—James Lowe
Attorney, Agent, or Firm—Robert M. Handy

[57] ABSTRACT

Injection or transfer molding of plastic is performed in a manner that virtually eliminates flash. Deflection of the mold press is measured with the mold press in a clamping configuration. Then the support structure of the molds is arranged to apply an equal force to the mold face by configuring supporting pillars and bars such that they act as individual springs. Their spring constants and/or lengths are calculated to account for the actual deflection found in the mold press, thereby, producing a uniform pressure on the molds during clamping of the press.

10 Claims, 14 Drawing Figures

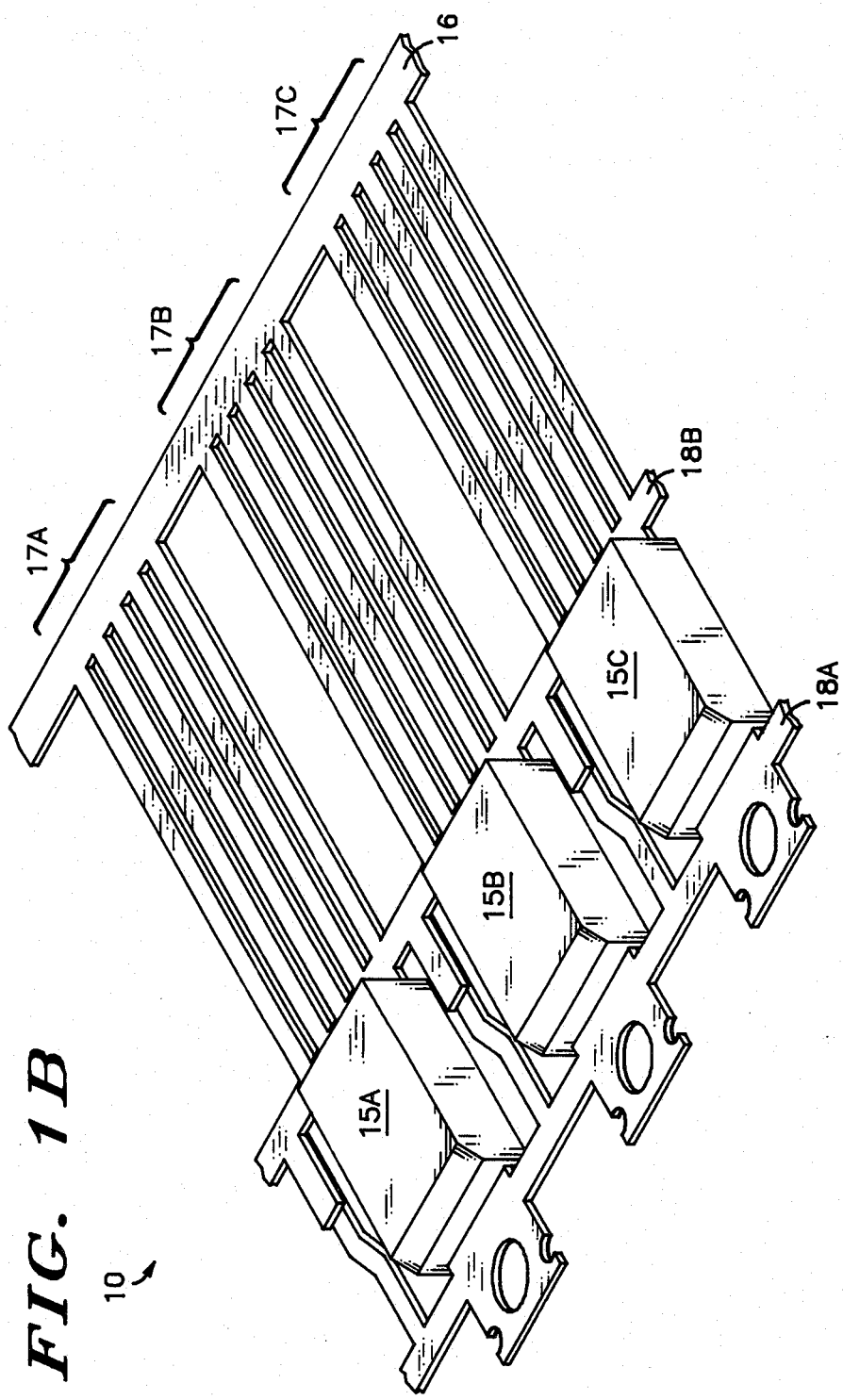

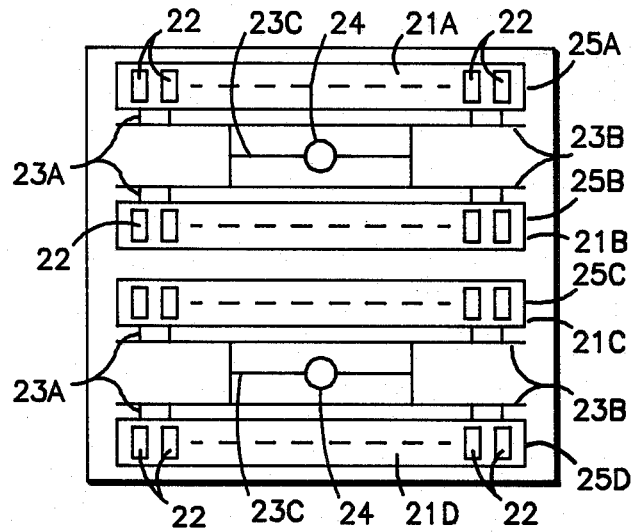
FIG. 2
FIG. 4
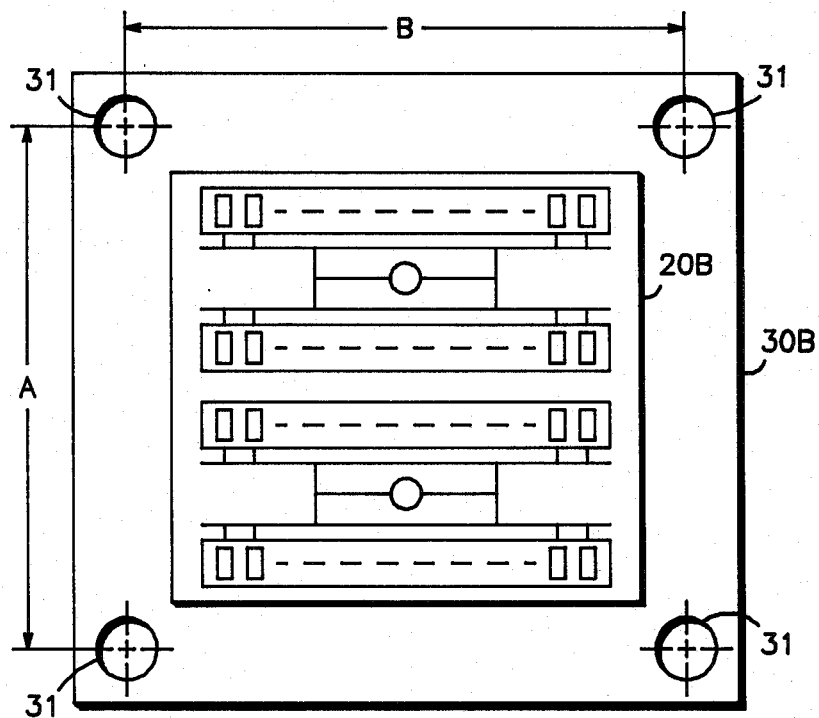

ENCAPSULATION MEANS AND METHOD FOR REDUCING FLASH

FIELD OF THE INVENTION

This invention relates in general to injection or transfer molding of plastic and more particularly, to improved means and methods for eliminating molding flash during plastic encapsulation.

BACKGROUND ART

Injection and transfer molding of plastic are widely used techniques for encapsulation of electronic devices, particularly semiconductor devices. Typically, multiple semiconductor devices are mounted on a ladder lead frame. A two part mold is generally used. Each half of the mold has a stiff backplate which is mounted on a platen of a hydraulic press. The mating surfaces of the mold are called the parting line or parting surface.

Initially the two halves of the mold are held apart. One or more lead frames containing semiconductor devices are placed in an exposed half of the mold. The hydraulic press is then actuated and the mold closed at the parting surfaces, forming a cavity around each semiconductor die. It is not unusual for a mold to contain $10^2$ to $10^3$ cavities. Each of these cavities is connected by one or more gates, channels, and runners to one or more central reservoirs or pots in which a softened plastic is placed. A worm screw or ram compresses the plastic so that it flows into the cavities. As soon as the plastic has hardened, the mold is opened and the encapsulated assemblies removed.

Frequently, moveable pins are built into the mold to align the mold parts, to hold the lead frames in a particular location during molding or to provide automatic ejection of the encapsulated parts. Also, the mold may contain other moving parts such as variable gates, vents, and dams. Thus, molds for encapsulating electronic parts, particularly semiconductor parts, are often very complicated and have numerous mechanisms protruding from the backplates of the mold. The mold halves generally have stiff backplates which are spaced away from the press platens by heavy steel mounting blocks or columns so as to allow room for pin actuators or other mechanisms.

In order to push liquified plastic from the reservoirs into the many cavities, it is frequently necessary to inject or transfer the plastic at pressures exceeding $10^3$ Psi ($6.9 \times 10^6$ Pa). If the mold halves fail to seal tightly against each other or against the lead frames, undesired or unintended crevices may be present therebetween. At such high pressures, the crevices fill with plastic during encapsulation, producing thin webs of plastic where none are desired. These thin webs of plastic are referred to as flash and result generally from imperfect sealing of the mold. Before the encapsulated electronic devices can be used, this flash must be removed. This increases the cost of manufacture and is undesirable. Also, flash is a significant cause of mold wear, requires additional labor for mold cleaning between molding cycles, and increases mold down-time.

In order to minimize flash, great pains are generally taken to machine the mating surfaces of the mold halves flat and parallel where they are to seal. Usually, they are carefully inspected for planarity during manufacture and after installation in the press. Powerful hydraulic cylinders in the mold press are used to force the mold halves tightly against the lead frames and each other. However, the force which can be applied in an effort to seal the mold is limited, since excessive force causes coining of the lead frames and rapid mold wear. Despite these efforts, flash continues to occur, even in the most carefully fabricated molds. Often this flash is localized to particular portions of the mold.

In the prior art it has been common to attempt to eliminate flash by placing shims under some of the mounting blocks between the mold backplates and the press platen. While this may improve sealing in one region of the mold, it frequently causes flash to appear in another region of the mold. The larger the mold, the more severe the problem. The placement of shims varies from press to press and is accomplished by trial and error.

Another approach to flash elimination has been to use spring loaded moving inserts in the critical portions of the mold form itself where sealing must be achieved. The purpose of the moving inserts is to permit portions of the sealing surfaces in different parts of the mold to adjust or compensate for distortions in the mold, mounting blocks, or press. A disadvantage of this approach is that providing moving inserts makes the mold much more expensive to fabricate and operate. In particular, the moving inserts which are exposed to the plastic during transfer tend to bind and jam so that mobility is lost after only a short time in service. The mold must then be disassembled and cleaned to restore motion to the inserts. This is expensive and causes substantial mold down-time.

Thus, a need continues to exist for improved means and methods of encapsulation for electronic devices which eliminates unwanted flash.

Accordingly, it is an object of the present invention to provide an improved means for setting up molds for plastic encapsulation of electronic devices wherein the mating surfaces of the mold are arranged to seal uniformly across the mold so that flash is substantially eliminated.

It is a further object of the present invention to provide an improved means for mounting molds in molding presses so as to provide more perfect mold sealing to substantially eliminate flash.

It is an additional object of the present invention to provide an improved method for encapsulation of electronic devices wherein the occurrence of mold flash is substantially reduced.

As used herein in describing mounting of molds or mold backplates to press platens, the words mounting block or blocks are intended to include any attachment means and not be limited to a particular mounting block shape. For example, mounting blocks may be solid or hollow, and have a cross-sectional geometry which is square, round, rectangular, H-shaped, L-shaped, Z-shaped, or combinations thereof. Further, the mounting blocks may vary in cross-section along their length.

SUMMARY OF THE INVENTION

The attainment of the foregoing and other objects and advantages is achieved through the present invention wherein the flexure of the mold platens during mold sealing is measured and the compressibility of the mold mounting blocks adjusted as a function of lateral position on one or both platens in order to compensate for platen flexure so that a constant force is applied to the parting surface of the mold independent of lateral position on the parting surface. In a first embodiment, compensation is achieved by using mounting blocks of equal cross sectional area per unit mold area and equal stiffness, but having different lengths, the length of each mounting block being varied in accordance with predetermined formulas depending upon the position of the block on the platen and the predetermined platen deflection. In a second embodiment, the lengths of the mounting blocks are kept constant and their stiffness is varied as a function of position on the platen and the platen flexure, in accordance with predetermined formulas. One way to vary the stiffness of the mounting blocks is to vary the cross-sectional area of the block. In a third embodiment, a combination of varying length, and varying stiffness are used, the length and stiffness being determined in accordance with predetermined formulas which depend on the lateral location of the mounting block on the platen and the amount of platen flexure.

BRIEF DESCRIPTION OF THE DRAWINGS

FIGS. 1A–B show, respectively, portions of a typical ladder lead frame for semiconductor die, before and after encapsulation;

FIG. 2 shows, in simplified form, a plan view of the lower half of a typical mold adapted to receive multiple ladder lead frames of the type depicted in FIG. 1A;

FIG. 4 shows a simplified plan view of an upper mold half and upper platen for the press of FIG. 3A, as viewed from between the mold halves;

DETAILED DESCRIPTION OF THE DRAWINGS

In the present invention deflections occurring in a mold press are determined and "springs" are then located in appropriate positions to compensate for such deflections so that the mold is uniformly closed to prevent leakage of plastic material used in the mold. By applying a uniform load to the mold, less pressure or load is required thereby permitting use of a lower clamping force for the mold press. The "springs" are provided by metal blocks. Since different value "springs" will be required in different locations, the metal blocks are varied in length or in cross-sectional area to obtain the different values of spring or elasticity that is required. Although the present invention is explained in relation to compensating for upper platen deflection it will be understood that lower platen deflection can be compensated for in the same manner.

Figure 1A:
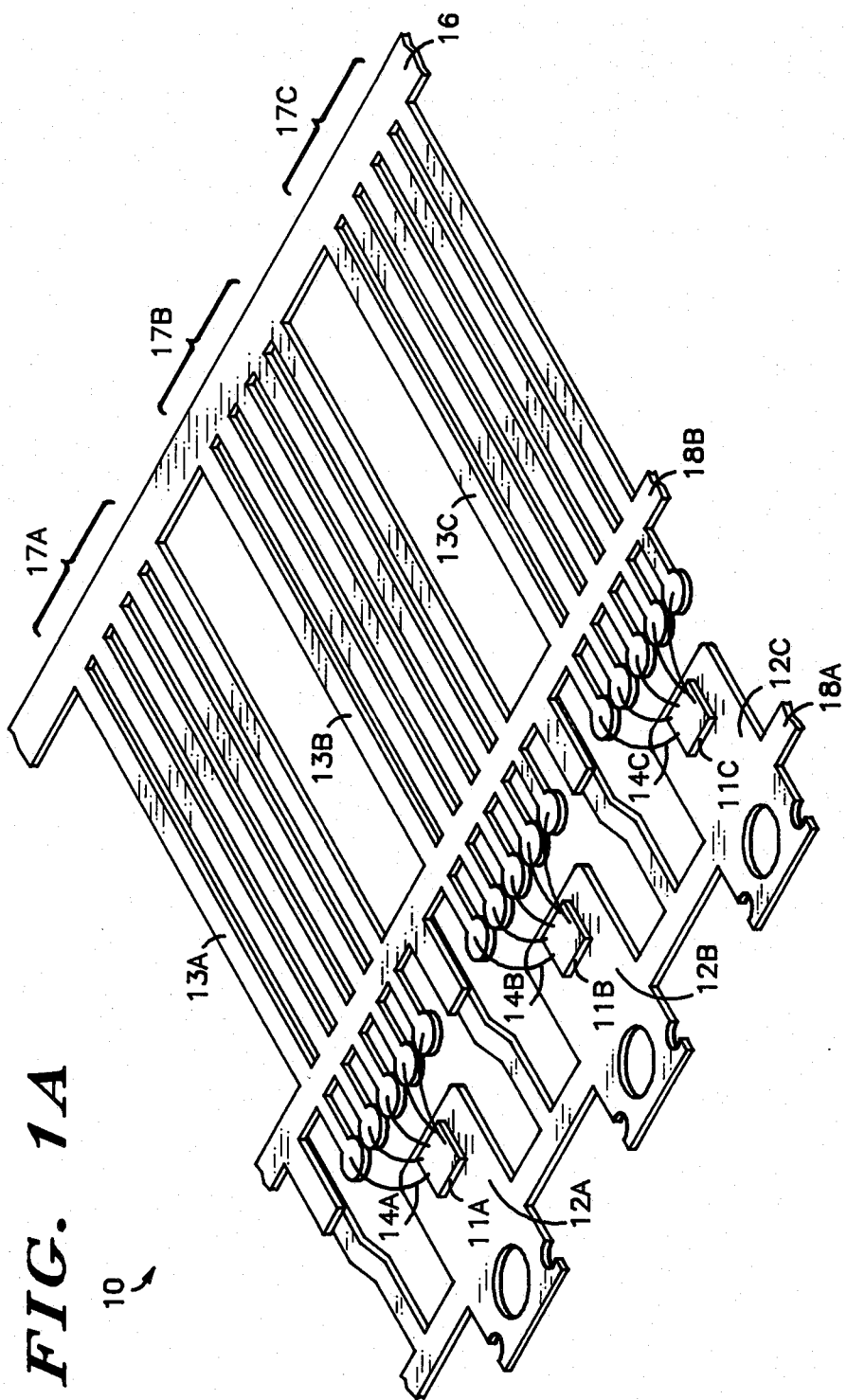

FIG. 1A shows, in simplified form and prior to encapsulation, ladder lead frame 10 having multiple semiconductor die 11a–c mounted on flag portions 12a–c and coupled to lead portions 13a–c by wire-bonds 14a–c. FIG. 1B shows the same lead frame after molding for plastic encapsulation of regions 15a–c around semiconductor die 11a–c and wire-bonds 14a–c. Lead frame 10 has side rail 16 which ties together the individual device portions 17a–c. Flag portions 12a–c and lead portions 13a–c are supported and connected by shorting bars 18a–b, respectively. Shorting bars 18a–b are cut away after molding. During molding the upper and lower halves of the mold (see FIGS. 3A–B) seal against one or both shorting bars 18a–b which act as dams to prevent the spread of the plastic encapsulant into the spaces between the individual leads and device portions. Generally, shorting bars 18a–b are flat and smooth to facilitate a tight seal against the mold halves. A typical ladder lead frame adapted for use with semiconductor devices is described in U.S. Pat. No. 4,084,312 which is incorporated herein by reference.

FIG. 2 shows, in simplified form, a plan view of lower half 20a of typical injection or transfer mold 20 (see FIG. 3B) adapted to receive ladder lead frames 10 of the type illustrated in FIG. 1A. Injection and transfer molding systems differ mainly in the method used to input the plastic under pressure into the channels, gates, and cavities of the mold. The sealing requirements for both are similar. In transfer molding, elements of the mold itself are used to pressurize the plastic during the molding cycle. In injection molding, elements external to the mold pressurize the plastic for the molding cycle. Lower mold half 20a contains multiple recesses 21a–d to receive lead frames 10. Individual device cavities 22 are indicated in schematic form, but not in detail. Individual device cavities 22 are connected by gates 23a, runners 23b, and channels 23c to reservoirs 24. Reservoirs 24 are adapted to receive the plastic encapsulation material (not shown). Upper mold half 20b (see FIG. 3A) mates with lower mold half 20a, and has a similar arrangement of recesses which fit around lead frames 10 and form the upper half of device cavities 22. In FIG. 2, gates 23a, runners 23b, and channels 23c are depicted as being located in lower mold half 20a, but this is not essential. They may equally well be located in upper half 20b or both halves 20a–b. As used herein, the words chase assemblies are intended to refer to those portions 25a–d of mold halves 20a–b which contain recesses 21a–d for lead frames 10 and device cavities 22, and which seal against portions 18a–b of lead frames 10. In general, chase assemblies 25a–d are the most complex portions of mold 20 and also the portions where flash most often occurs and is most troublesome.

Figure 3A:
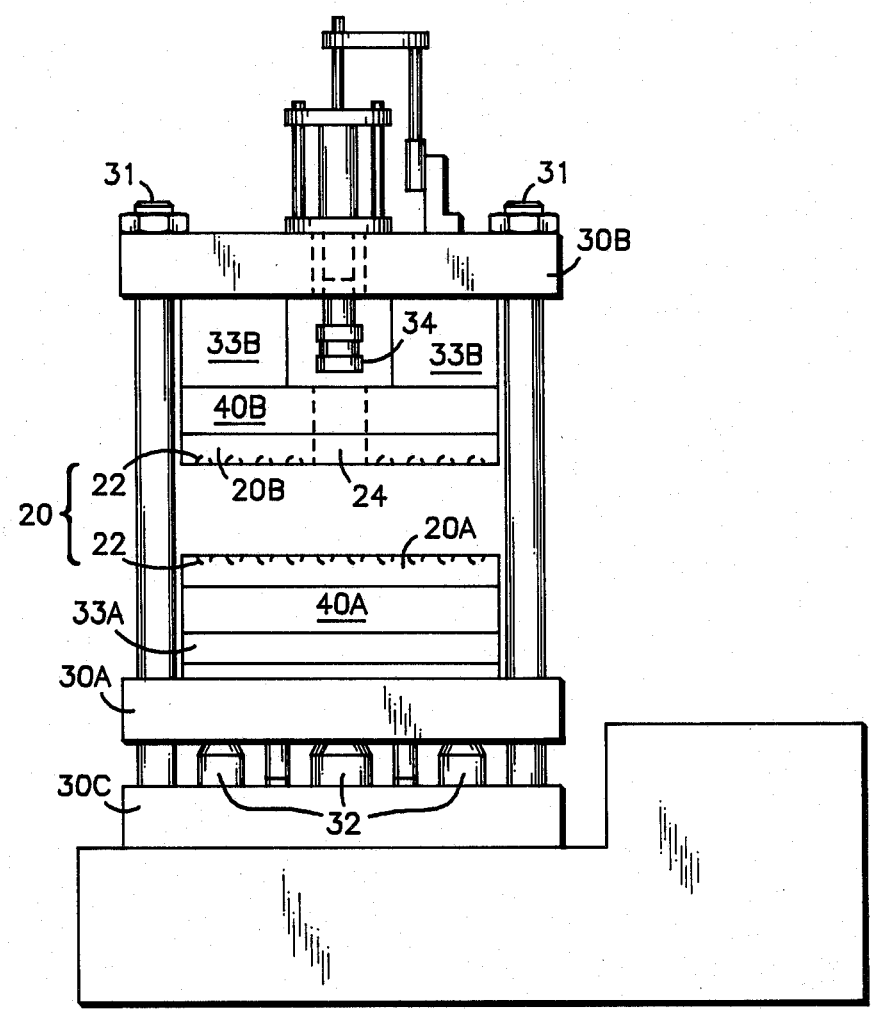
FIGS. 3A–B show, in simplified form, a side view of a conventional mold press adapted to receive molds of the type depicted in FIG. 2, in the open and closed position, respectively.
Figure 3B:
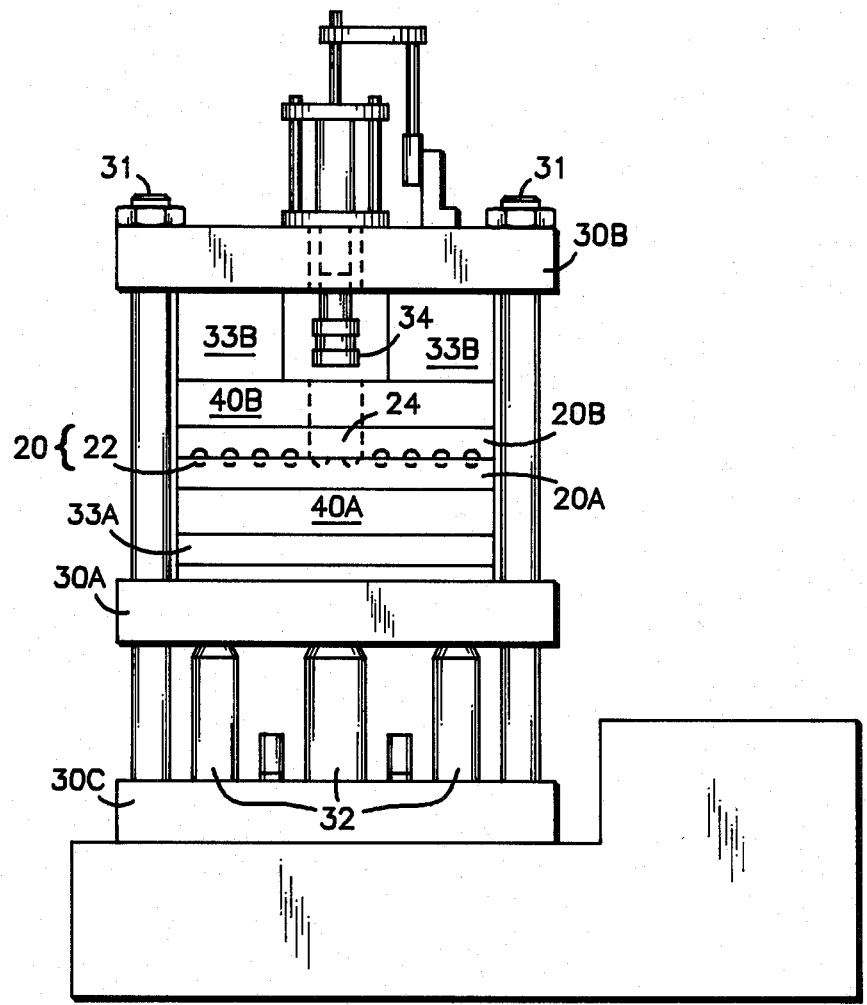

FIGS. 3A–B show side views, in simplified form, of transfer mold press 30 having lower platen 30a, upper platen 30b, and base 30c. An injection mold press could also be used. Most commonly, upper platen 30b is fixed with respect to base 30c, and is connected to base 30c by guide posts and supports 31. Lower platen 30a moves toward and away from upper platen 30b along guide posts and supports 31 under the action of one or more hydraulic pistons 32. Lower mold half 20a is mounted on support plate 40a and attached to lower platen 30a of press 30 by mounting blocks 33a. Upper mold half 20b is mounted on support plate 40b and attached to upper platen 30b by mounting blocks 33b. Support plates 40a–b facilitate fabrication and assembly of mold halves 20a–b by providing a planar reference surface for accurately locating the mold halves and the sealing surfaces during assembly and after mounting in press 30.

FIG. 3A shows mold press 30 with mold 20 in the open position, and FIG. 3B shows mold press 30 with mold 20 in the closed position. After press 30 and mold 20 are closed and clamped by hydraulic pistons 32, plastic encapsulant (not shown) is placed in reservoir 24 under transfer piston 34. Transfer piston 34 is lowered into reservoir 24, compressing the encapsulant. The encapsulant liquifies and flows rapidly through the channels, runners, and gates into cavities 22 surrounding semiconductor devices 11a–c. After the encapsulant hardens, the pressure on pistons 32 is relaxed, mold 20 is opened, and lead frames 10 are removed. A typical molding machine and method for encapsulation of electronic devices is described in U.S. Pat. No. 4,386,898 which is incorporated herein by reference. There can be one or more plastic reservoirs 24 and associated transfer pistons 34. The particular number is not essential to this invention.

With electronic devices, particularly semiconductor devices, mold 20 may contain $10^2$ to $10^3$ device cavities 22. Cavities 22, gates 23a, runners 23b, and channels 23c will then have small cross sectional dimensions compared to their distance from the central reservoir or reservoirs 24. The working life of thermosetting plastic encapsulants suitable for injection molding is very short once the plastic has been liquified. Hence, injection from the reservoir into the cavities must take place in a very brief time, usually of the order of a few seconds. In this situation, pressures exceeding 1000 Psi ($6.9 \times 10^6$ Pa) must often be applied to the plastic to insure that it flows from the reservoir to the furthest cavity before the plastic hardens. The hydraulic pressure of the liquified plastic encapsulant is transmitted to the mold, and because of the comparatively large area of most molds, this creates a very large force tending to push the mold halves apart. This hydraulic parting force is opposed by the clamping force exerted by pistons 32 of press 30. Press clamping forces in the range 50–300 Tons ($4.5–27 \times 10^4$ Kg) are commonly used to keep the mold halves tightly closed. The larger the mold, the greater the force required. The maximum force which can be applied is limited by the cross-sectional contact area of the mold halves against the lead frames and against each other. The pressure exerted on these contact areas by the press must remain below the yield strength of the lead frame material or the mold material, otherwise coining of the lead frame and damage to the mold results.

FIG. 4 shows a simplified plan view of upper mold half 20b on upper platen 30b, as viewed from between mold halves 20a–b with press 30 in the open position. For clarity, the various alignment pins and ejection means which are frequently found in electronic device molds have been omitted. Typical alignment and ejection means are described in U.S. Pat. No. 4,388,265 which is incorporated herein by reference. It should be noted that it is common to mount mold halves 20a–b so that they are centrally placed on platens 30a–b, lying within the perimeter bounded by guide posts and supports 31 of press 30.

If mold halves 20a–b fail to seal tightly against each other or against lead frames 10, then flash will be produced which must be subsequently trimmed from the encapsulated parts after molding. The larger the capacity of the mold, the larger the mold area and the greater the difficulty encountered in avoiding flash. With the plastic injection pressures typically used for encapsulating electronic devices, it has been found that crevices or gaps above about $25 \times 10^{-6}$ inches (0.625 micrometers) in height are penetrated by the liquified plastic encapsulant and flash is formed therein. Thus, to avoid flash, the mating surfaces of the mold halves and lead frames exposed to the liquified plastic must seal to within about $25 \times 10^{-6}$ inches (0.625 micrometers) over the entire lateral extent of the mold. With molds 15–40 inches (38–100 cm) on a side, this is extremely difficult to do. Hence, in the prior art, flash has been a continuing problem. Shims inserted under mounting blocks 33a–b by trial and error are used in the prior art to reduce the flash in particular areas of the mold. However, it has usually not been possible with the prior art arrangements to eliminate flash entirely in a mold of significant size. Moreover, when the mold is moved to another press, it is often found that the shims must be completely rearranged.

The platens of mold presses are generally of solid steel and very thick. For example, a typical 150 Ton ($13.6 \times 10^4$ Kg) capacity press having platens measuring $28 \times 38$ inches ($71 \times 97$ cm) and able to accept molds up to $18 \times 28$ inches ($46 \times 71$ cm) will have steel platens 5–7 inches (13–18 cm) thick. The stiffness of the platens is enhanced by the mold, the support plates, and the mounting blocks. With simple molds, as are shown for example in U.S. Pat. No. 3,405,214, incorporated herein by reference, the mounting blocks are substantially continuous, so that a very stiff structure is obtained. When the mold press is clamped shut, the platens, mold, support plates, and mounting blocks act together to resist deflection. Under these circumstances, deflections may be minimal. However, with encapsulation molds for electronic devices, continuous mounting blocks cannot always be used since space must be left behind the mold halves and support plates for the plastic transfer piston, and for the alignment and ejection pin actuation mechanisms. Thus, for many electronic device molds, mounting blocks are placed principally at the periphery of the mold, as is illustrated in U.S. Pat. No. 4,386,898. It has been common in the prior art to use mounting blocks of comparatively large cross-sectional area at the periphery of the mold, with a few mounting blocks of smaller cross-sectional area located within the perimeter where permitted by the actuation mechanisms.

Figure 5:
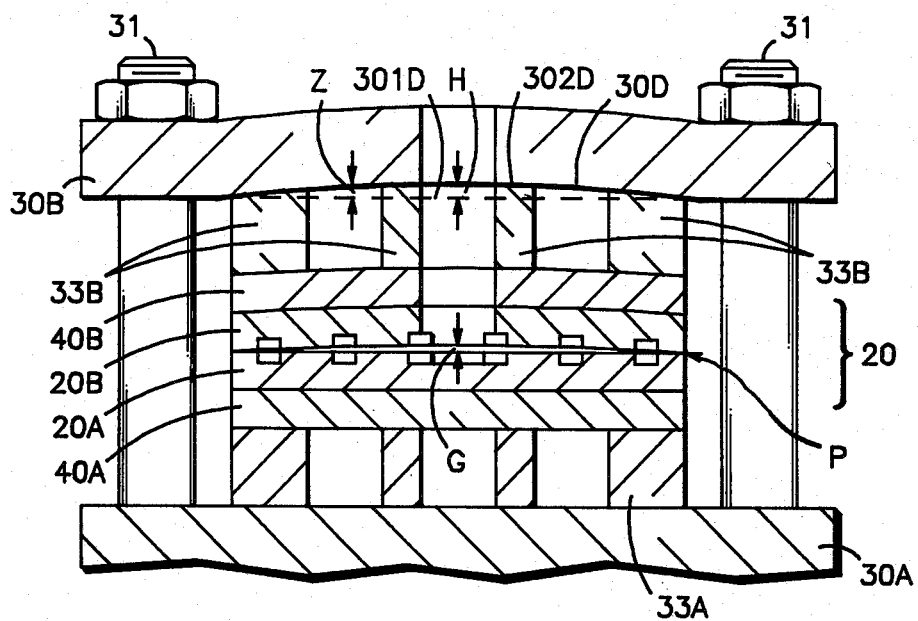
FIG. 5 is a simplified cross-sectional view of the upper portion of the mold press of FIG. 3B, with the flexure of the upper platen and mold half exaggerated for easy visibility.

It has been found that despite their great thickness, the platens of the mold presses distort under the required clamp forces by amounts which are large compared to the maximum allowable sealing gap of about $25 \times 10^{-6}$ inches (0.625 micrometers). This situation is illustrated in FIG. 5 which shows a simplified cross-sectional view of the upper portion 30b of mold press 30 of FIG. 3B, with the vertical distortion of the mold platens exaggerated in order to reveal the flexure of lower surface 30d of upper platen 30b after mold 30 is clamped. Dashed line 301d shows the initial position of lower surface 30d of platen 30b when mold 20 is open or closed but not clamped. Solid line 302d shows the final position of lower surface 30d of platen 30b after press 30 clamps mold 20 with the force required during molding.

It has been found that mold distortion due to platen flexure can be compensated and flash avoided by measuring the platen deflection at one centrally located point on the platen at a press loading corresponding to the anticipated clamping force during molding, then calculating the platen deflection for other locations on the platen where mounting blocks are desired to be placed, and then adjusting the stiffness and/or length of the mounting blocks at these locations to provide for transmission of equal force per unit mold area to the mold when clamped. This is done in the following way.

A stress transmitting member is placed between the platens of the press. A convenient form for this stress transmitting member is a rectangular or circular block of metal having a cross-sectional area perpendicular to the platens which is a small fraction of the platen area, centrally located between the platens. This arrangement makes analysis of the resulting platen flexure and determination of the proper equation for calculating the deflection as a function of position on the platen simpler as will become apparent with the detailed description of FIGS. 9A and 9B. However, other shapes can be used, as well as multiple blocks of metal.

Stiff metal bars are conveniently placed across the tops of the upper platen support posts 31 to provide a reference plane for measuring the upper platen deflection. A dial gauge or other deflection measuring means is placed against the surface of the upper platen in as central a location as possible. Where a hole or interfering machinery is present on the platen which prevents the gauge from being located in the exact center of the platen, the gauge is placed as close as practical and the radial distance to the center noted. The gauge is set to zero indicated reading. With the stress transmitting block in place the press is closed and the requisite clamping force applied. The new reading of the dial gauge or other measuring means provides a direct measure of the deflection of the platen at the measuring location. This measurement is then used to estimate the deflection at other locations on the platen where mounting blocks are desired to be placed. The following is an example of the application of this method.

Measurements made on a 185 Ton ($16.8 \times 10^4$ Kg) capacity press manufactured by the Stokes company of Philadelphia, PA having platens 30$a$–$b$ measuring $24 \times 32.5$ inches ($61 \times 83$ cm) between guide posts 31 and containing mold 20 measuring about $18 \times 23.5$ inches ($46 \times 60$ cm) centrally located on platens 30$a$–$b$, showed that upper platen 30$b$ bowed upward by about 0.008 inches (0.2 mm) under a clamping pressure of 185 Tons ($16.8 \times 10^4$ Kg). This deflection is several hundred times the maximum allowable mold seal gap for avoiding flash. The maximum platen deflection was found to occur in the center of the platen and to taper monotonically to zero toward guide posts and support columns 31. It was further found that there was comparatively little distortion occurring in the lower platen of this press, due to the fact that the central area of the lower platen was supported on a single large cylinder centrally located under the platen and having a structural diameter of about 16 inches (41 cm).

These results show that, even though the mating surfaces of the mold are machined and mounted to be parallel and matched when initially installed in the open press and to mate perfectly when the press and mold are initially closed but not clamped, the mating surfaces do not remain parallel and properly sealed when the requisite clamping force is applied. The flexure of the one or both platens distorts the mold halves and prevents the parting surfaces from remaining in good contact under full clamping force. The distortion of the mold is different in different lateral positions in the mold so that flash may occur in one part of the mold but not in another. It has further been discovered, that the mounting arrangements used in the prior art, which have employed very stiff peripheral mounting blocks, exacerbate the effects of platen distortion and promote the occurrence of flash.

The mounting blocks used to attach the mold and/or mold support plates to the press platens act as springs when the mold is clamped. These mounting blocks transmit the clamping force supplied by the press to the mating surfaces of the mold. If the mounting blocks above different parts of the mold have different cross-sectional areas or different stiffness they will have different spring constants, i.e., different force per unit change in length. Also, if they are compressed by different amounts, they will transmit different amounts of force to the portions of the mold on which they rest. It can be shown that the flexure of the platens has the effect of compressing the mounting blocks located above different parts of the mold by different amounts, resulting in the uneven transmission of force to the mating surfaces. As a consequence, the gap between the mating surfaces is not reduced in all parts of the mold below the minimum clearance for avoiding flash.

Upper platen 30$b$ of mold press 30 is supported at four points by guide posts and support columns 31 attached to base 30$c$. When press 30 is clamped, platen 30$b$ is deflected upward in the center by the force transmitted through mold 20 from lower platen 30$a$. This situation is illustrated in FIG. 5 which shows in schematic form a cross-sectional view through mold 20, upper press platen 30$b$, and lower press platen 30$a$ when mold 30 is closed and clamped with sufficient force to deflect upper platen 30$b$. Upper platen 30$b$ is deflected upward by an amount H at its center and by variable amounts z at different distances from the centerline of platen 30$b$. Because mounting blocks 33$b$ all have the same length, the deflection of upper platen 30$b$ is transmitted by mounting blocks 33$b$ to mold support plate 40$b$ and mold half 20$b$, producing gap g at parting line p of mold 20.

Under a first method for determining the deflection at different locations on the platen, the distorted or deflected shape of upper platen 30$b$ is assumed to be spherical in shape. With this assumption, and taking upper platen 30$b$ to be initially flat, the deflection z of lower surface 30$d$ of platen 30$b$ from its initial position when the mold is open (or closed but not clamped), and its final position after the clamping force is applied, as a function of the radial distance R from the center of the platen, can be approximately calculated as:

$$z = [(D/2)^2 - R^2]^{\frac{1}{2}} - (D/2) + H, \text{ where} \tag{1}$$

$$D = (A^2 + B^2)/4H, \text{ and} \tag{2}$$

where A and B are the lateral separations between the centers of guide posts and support columns 31 attaching upper platen 30$b$ to base 30$c$ (see FIG. 4), and where H is the measured maximum deflection of the center portion of upper platen 30$b$. D is the diameter of a sphere approximating the deflected shape of platen 30$b$. If upper platen 30$b$ has a hole located in the center to permit the entrance of plastic feed piston 34, as is often the case, H is estimated from the measured deflection at the perimeter of the central hole and radius of the hole. This may be done using the same equations.

Figure 8:
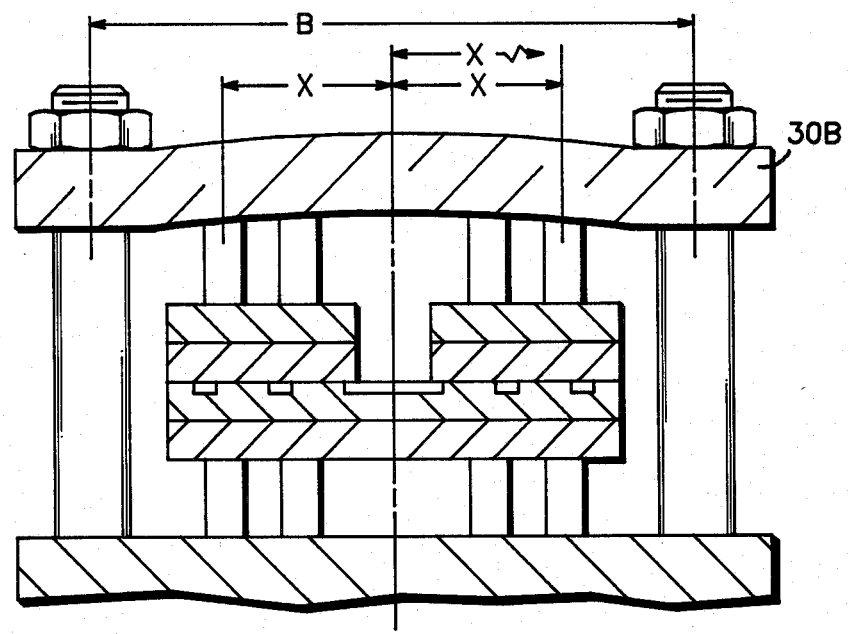
FIG. 8 is a simplified cross sectional view of a molding press useful in understanding the equations used.

Under a second preferred method, referring to FIG. 8, for determining the deflection at different locations on the platen, the platen is assumed to have a cylindrical shape over the mold which joins tangentially to a flat shape between the edges of the mold mounting blocks and the platen support posts. Under this assumption, the deflection z of the platen as a function of the distance x measured along the long dimension B of the mold from the center, has two components $z_m$ and $z_u$ where $z = z_m + z_u \cdot z_m$ is the deflection in the region of the platen between the center of the platen and the outermost mold mounting blocks and $z_u$ is the deflection of the platen between the outermost mold mounting blocks and the centerline of the platen support posts. It can be shown that $z_m$ and $z_u$ are given by, $$z_m = (C/2)[1 - \cos(\arcsin 2x/C)] \tag{3}$$

$$z_u = [(B/2) - X] \tan(\arcsin 2X/C), \tag{4}$$

where B is the length between the centers of the support posts of the longest dimension of the press, x is the distance from the center of the press (and mold) to the location of interest, [(B/2)−X] is the distance from the center of the outermost mounting block of the mold to the support column centerline measured in the same direction as X, and C is the diameter of a cylinder approximating the deflection of the platen. X is the actual distance of the outer most mounting block of the mold from the center line. FIG. 8 illustrates the application of equations (3) and (4) in estimating the deflected shape of upper platen 30b.

The parameter C in the above equations is chosen to give total deflection $z = z_m + z_u$ equal to the observed total deflection H. Equations (3) and (4) are solved by iteration to determine the value of C that gives the observed value of H.

According to a first embodiment of the present invention, it has been found that if mounting blocks 33a–b are arranged to have the same cross-sectional area per unit area of the mold, and their length is adjusted as a function of their radial distance R from the center of the platen, so that the separation between the lower surface of the platen and a reference plane of the mold, is varied in accordance with equations (1) and (2) or (3) and (4), then the distortion and flexure of the press platen as a result of applying the clamping force is compensated and flash is substantially reduced or eliminated.

In particular, the mating surface of upper mold half 20b, rather than initially being a flat plane, as in the prior art, is initially distorted to be bent convex downward by making the centrally located mounting blocks longer than the mounting blocks located further from the center of the platen, according to the above formula. The prior art practice of placing most or all of the mounting block area at the perimeter of the mold is modified in favor of distributing the mounting blocks as uniformly as possible over the mold, within the constraints imposed by the need for access to the plastic reservoir and any pin actuators. The effect of using mounting blocks of different length is to distort the mold when the press is open by an amount equal to and complementary to the amount of distortion or deflection in the platen after clamping. The platen deflection then brings the mating surface back to the desired plane after clamping. The amount of predistortion required to achieve a planar sealing surface after clamping is given approximately by equations (1) and (2), or (3) and (4) above.

Figure 6:
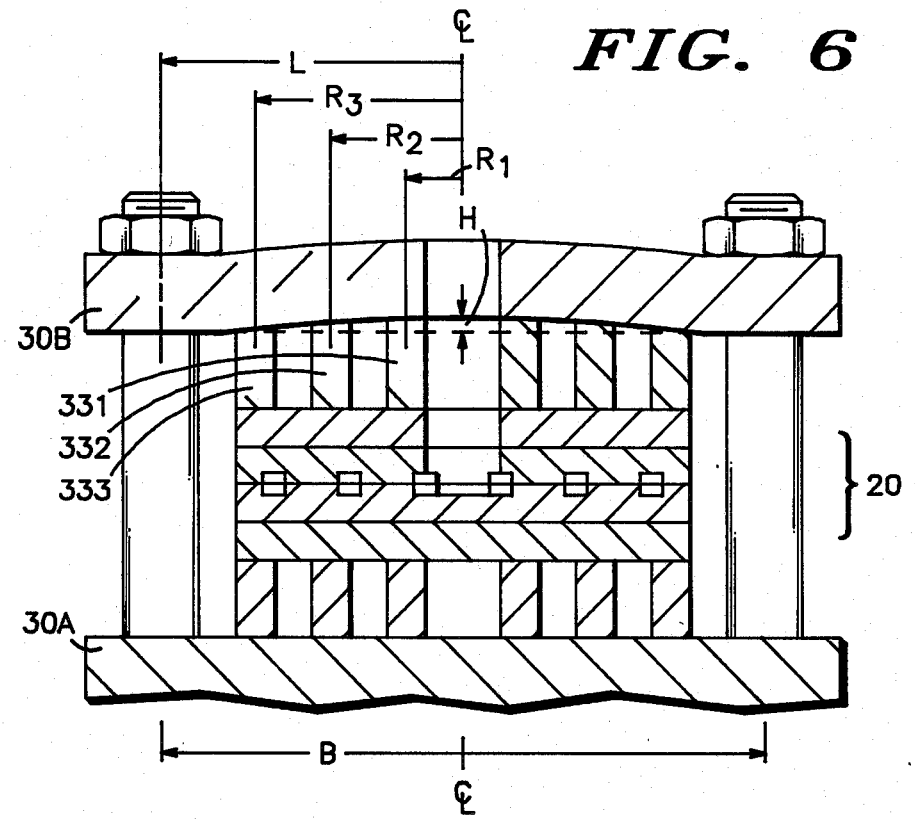
FIG. 6 is a simplified cross-sectional view similar to FIG. 5 but showing mold mounting blocks of varying height to compensate for platen flexure, according to a first embodiment of the present invention.

An example of the practice of this method of compensating for platen distortion is illustrated in FIG. 6. FIG. 6 shows the same mold and press arrangement as in FIG. 5 but with equal length mounting blocks 33b replaced by graduated length mounting blocks 331, 332, and 333, located at distances $R_1$, $R_2$, and $R_3$, respectively, from the centerline of platen 30b, where the differences in lengths of mounting blocks 331–333 are determined according to equations (1) and (2). For example, block 333 has a length which is less than the length of block 331 by the amount of $z_3 - z_1$, where $z_3$ and $z_1$ are the values of equation (1) evaluated at $R_3$ and $R_1$ respectively.

In a second embodiment of the present invention, the lengths of the mounting blocks above different portions of the mold are held constant, and the cross-sectional areas S of the mounting blocks varied as a function of their distance R from the center of the platen, according with the following equation:

$$F = (S)(E/L)(dL), \tag{5}$$

where F is the force desired to be transmitted by the individual mounting block, E is the modulus of elasticity of the material used, L is the length of the mounting block, and dL is the change in length of the blocks. The difference in force dF exerted on different parts of the mold due to platen flexure is given approximately by:

$$dF = -(S)(E/L)(z - z_o), \tag{6}$$

where $z_o$ is the value of z at the value of R equal to the distance from the center to the corner of the mold, i.e., half the mold diagonal. Generally, in order to apply force uniformly to all parts of the mold, it is desired that the same force F be applied to every unit area of the mold. According to equation (5), if all mounting blocks are initially of the same length, and are deflected by different amounts $z - z_o$ due to the flexure of the platens, then the cross sectional area S and/or the stiffness of the mounting blocks E/L, per unit of mold area, must be varied as z varies across the mold. As has been shown in equation (1) and (2), and (3) and (4), z varies in a known fashion with the distance of the block from the center of the platen. According to equation (6), either the area or the stiffness of the mounting blocks must decrease as the radial distance of the mounting blocks from the center of the platen is increased. This result is contrary to the practice of the prior art, which has generally placed the stiffness and largest area mounting blocks at the periphery of the mold. It will be recognized by those of skill in the art that the cross-sectional area, e.g. stiffness, need not be uniform along the whole length of a mounting block, but can be restricted for convenience of adjustment to a small portion of the height or length of the mounting blocks.

According to a third embodiment of the present invention, variations in height and cross-sectional area of the mounting blocks can be made simultaneously, as a function of their distance from the center of the platen so as provide greater flexibility of mounting. This is especially desirable where the rear surface of the mold or mold support plate contains numerous actuation or ejection pins which must be kept free. For example, centrally located mounting blocks can be of greater length according to equations (1) through (4), while other mounting blocks at a greater distance from the center of the platen may be of varying cross-sectional area, or of different material and the same or different area, according to equations (5) and (6). Thus, z, S, and E/L may be varied simultaneously in accordance with equations (1)–(6), as has been explained above, to obtain uniform sealing force at the mating surfaces and compensate for the observed distortion of the mold platens.

Figure 7A:
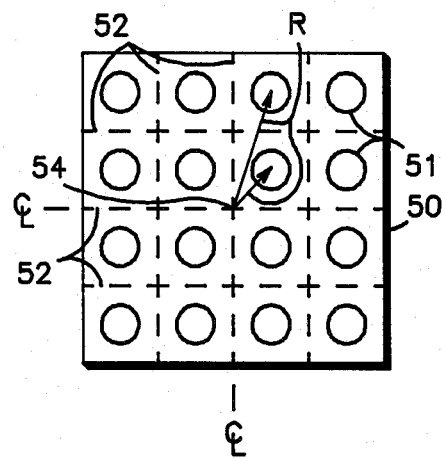
FIGS. 7A–C are simplified plan views of a mold and associated mold mounting blocks used to compensate for platen flexure, according to further embodiments of the present invention.
Figure 7B:
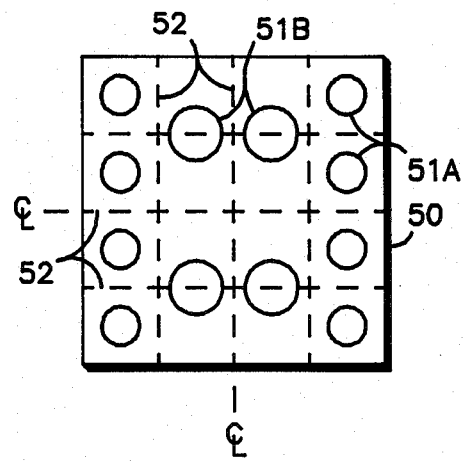
Figure 7C:
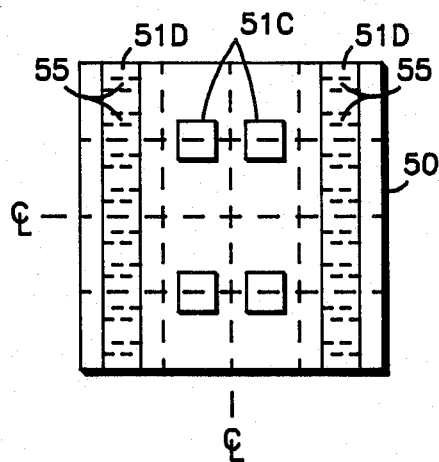

The following is an example of the practice of the method of the present invention. FIGS. 7A–C show in simplified form a plan view of mold half 50 and mounting blocks 51 used for attaching mold half 50 to, for example, upper platen 30b of press 30. As a guide for positioning the mounting blocks, dotted lines 52 have been drawn on mold half 50 to indicated equal unit areas of the mold. It is desirable that mounting blocks 51 be placed above the mold chases, since the largest number of sealing surfaces are located in the mold chases and it is particularly desired to avoid flash in the chase regions.

In FIG. 7A, there is one mounting block on each unit area of the mold, and all blocks have the same cross-section S. In this example, mounting blocks 51 are shown as having circular cross-section, but other cross-sections could equally well be used. The lengths of mounting blocks 51 are varied according to equations (1) and (2) or (3) and (4), depending upon their individual distances R from center 54 of mold 50 which has been placed on the center of platen 30b.

In FIG. 7B, there is one mounting block 51a on each of the outer unit squares along the left and right edge of the mold but only one mounting block 51b for every two of the central squares. In order to have the same force transmitted to the mold, mounting blocks 51b on the central squares must have twice the area, or twice the stiffness, of blocks 51a at the periphery, since they support twice the unit mold area. In addition, central mounting blocks 51b must have different lengths, as provided by equations (1) and (2) or (3) and (4).

In FIG. 7C, there is one mounting block 51c on each central unit area of the mold, but the peripheral squares at the left and right are supported by continuous bars 51d, rather than discrete mounting blocks. In order to compensate for the larger overall area of continuous mounting bars 51d, bars 51d must be chosen either to have a lower stiffness, SE/L, than central mounting blocks 51c, or to be hollowed out so that the effective cross-sectional area is reduced. This can easily be accomplished, for example, by drilling holes in mounting bars 51d to reduce their net cross-sectional area in a direction perpendicular to the mold surface. The holes are shown by dotted lines 55.

The following is an example of the practice of a method for encapsulating semiconductor devices, according to the present invention.

Mold 20 having chase regions 25 and cavities 22 adapted to receive lead frames 10, or the like, is mounted in press 30 by means of mounting blocks whose relative length as a function of their distance from the center of the press platen is determined according to equations (1) and (2) or (3) and (4). Press 30 and mold 20 are initially in the open position. Leadframes 10 or equivalent, bearing semiconductor die 11a–c or equivalent, are inserted in one half of mold 20 and mold 20 closed by actuating press 30. A predetermined clamping force at least sufficient to resist the hydraulic pressure to be exerted by the injected or transferred plastic is applied to seal the mating surfaces of the mold halves against the lead frame and each other. A charge of plastic is inserted in reservoir 24 and compressed by piston 34 to cause it to liquify and flow through the runners, channels, and gates into cavities 22 surrounding semiconductor devices 11a–c. When sufficient time has elapsed for the injected plastic to harden, the clamping force is released, the mold opened, and the encapsulated parts removed.

In a further embodiment of the practice of the method of this invention for producing plastic encapsulated semiconductor parts, mold 20 is mounted in press 30 using mounting blocks whose cross-sectional area, stiffness, and length are varied according to equations (1)–(4) so that a constant clamping force is transmitted to the mold per unit mold area. According to equation (5) if a larger area mounting block is desired, this may be used provided the stiffness is reduced, e.g., by drilling holes through the block material, so that the product $(S)(E/L)$ remains constant. If it is desired to use blocks of equal length, then $(S)$ and $(E/L)$ are varied so that the product $(S)(E/L)(z-z_o)$ remains constant for different positions on the mold. The remaining steps in the process after mounting of the mold halves to the mounting blocks are then carried out as described above. The uniform clamping of the mating faces of the mold halves, in accordance with the practice of this invention, insures that flash from uneven clamping is substantially eliminated.

Figure 9A:
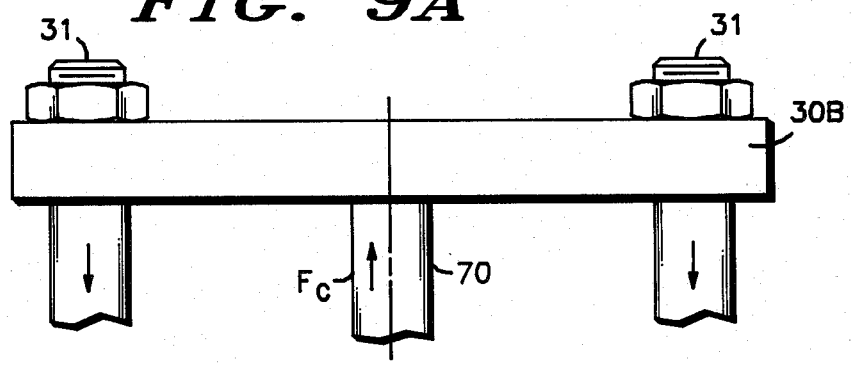
FIGS. 9A and 9B illustrate in simplified form different ways to elastically load an upper platen of a molding press for measurement of its elastic behavior.
Figure 9B:
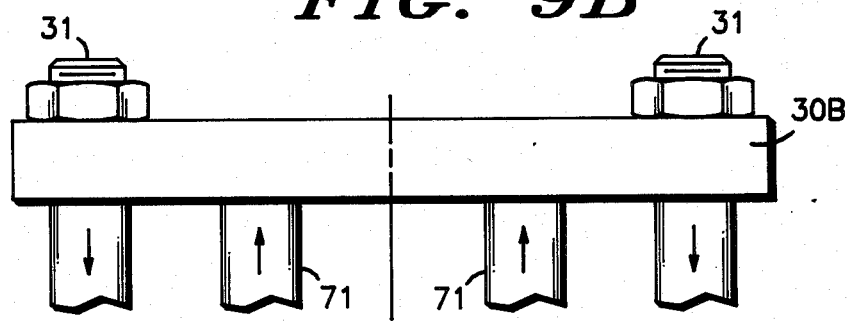

FIG. 9A illustrates a simplified cross section of an upper platen of a molding press which is loaded from below with a single centrally placed load in order to get a reference measurement of the platen's elastic response to use as the basis of determining its deflection with other types or distributions of loads applied. FIG. 9B is similar to FIG. 9A but with another type of load application to illustrate a method of improving the accuracy of the estimation of the elastic shape of the upper platen.

The deflected shape of the upper platen 30b is dependent on the manner and distribution of the loads applied to it by the mounting blocks which are installed and which react to the force applied to it by the lower platen under the action of the hydraulic cylinder(s). The upper platen 30b is a thick plate which is supported by support columns or tie rods 31 located at its periphery. Tie rods 31 act structurally as pin supports since they are of small cross section and sized to react the tension loads only. Developing an analytic solution for the elastic shape of upper platen 30b under a variety of loads is possible with modern analytic techniques (finite element) but is very expensive. Since using the methods described herein will be within the ability of the elastic elements applied to compensate for such approximation, the costly analysis is not required. In FIG. 9A, upper platen 30b restrained by tie rods 31 is loaded by a single central concentrated load applied by rod 70. Fc is the clamping force of the press.

In FIG. 9B, upper platen 30b is loaded by two rods 71, each with ½ of the total clamping force. FIG. 9B is more typical of the actual load applied to the upper platen by a mold since the load is distributed over a greater area of the platen as is typical of the mold as shown in FIG. 6. The elastic shape of the upper platen will be different for the loading cases illustrated by FIGS. 9A and 9B. It can be shown that the total deflection of upper platen 30b will be greater for the loading case of FIG. 9A as compared with the loading case of FIG. 9B. Therefore, in the application of equations (1)–(4) the variable that represents the radius of the curvature of upper platen 30b is adjusted to agree with the deflected shape of the upper platen under load using the measured or adjusted maximum center deflection of the upper platen as a coordination variable. When the equations (1)–(4) are so used to give an equivalent total center deflection of the upper platen under load, the radius of curvature defined by equations (1)–(4) will match the actual radius of curvature of the upper platen to a degree which can be accommodated by the support columns 331, 332, and 333 of FIG. 6.

Having thus described the invention, it is apparent that the present invention provides an improved means and method for mold attachment to mold presses and for molding electronic devices, wherein undesired molding flash is substantially reduced or eliminated. While the invented means and method has been illustrated for particular combinations of molds, presses, and mounting blocks, it will be understood by those of skill in the art that the invented means and method can be used with other presses and molds, and with mounting blocks of many shapes and sizes provided that they conform to the criteria established herein. Accordingly, it is intended to include all such variations in the claims which follow.

I claim:

1. A molding apparatus for encapsulating electronic devices comprising:

separable mold plates adapted to receive multiple electronic devices for encapsulation;

a press having a first moveable platen and a second fixed platen, said fixed platen being held by four posts, wherein said press is adapted for clamping said mold plates together between said platens with a predetermined force;

mounting blocks for attaching said mold plates to said platens;

wherein said mold plates and said platens have a common centerline perpendicular to said platens;

wherein said mounting blocks between said mold and at least one of said platens have different lengths as a function of their distance R from said center line;

wherein the differences in lengths (H−z) of said said mounting blocks are determined according to the equations, $(H-z) = (D/2) - [(D/2)^2 - R^2]^{\frac{1}{2}}$, where $D = (A^2 + B^2)/4H$, where A and B are the lateral separations between said posts, and where H is the measured deflection of the center of said at least one platen when said predetermined force is applied by said press.

2. A molding apparatus for encapsulating multiple electronic devices in a plastic material, comprising:

a press having an upper platen and a lower platen adapted to be moved together and apart during encapsulation;

wherein said upper platen has a downward facing first surface of predetermined first initial shape which deflects from said first initial shape by a first predetermined amount during encapsulation;

wherein said lower platen has an upward facing second surface of predetermined second initial shape which deflects from said second initial shape by a second predetermined amount during encapsulation, the sum of said first and second predetermined amounts constituting a predetermined press distortion amount;

a mold having an upper portion coupled to said first surface and a lower portion coupled to said second surface, wherein said upper portion of said mold has a lower parting surface and said lower portion of said mold has an upper parting surface, and wherein said lower and upper parting surfaces are intended to meet at a sealing surface during encapsulation;

first attachment means for coupling said upper mold portion to said first surface and second attachment means for coupling said lower mold portion to said second surface;

wherein at least one of said attachment means varies in height as a function of lateral position on said platens so that said lower and upper parting surfaces have a shape when said mold is open which departs from the shape of said sealing surface by an amount which is the complement of the predetermined press distortion amount plus a constant amount.

3. A molding apparatus for encapsulating multiple electronic devices, comprising:

a mold press having a base portion, a first platen, a second platen, and ram means coupled to said base portion and at least one of said first and second platens for moving said first and second platens together and apart;

wherein said first platen has a first attachment surface having a predetermined first shape when said mold press is open and a predetermined second shape measured when said mold press is closed under a predetermined clamping pressure, wherein a mold press distortion amount is determined as the difference between said first and second shapes, wherein said distortion amount has a maximum value at a particular lateral position on said first platen;

a mold having first and second separable parts, wherein said first part has a first mounting surface and a first parting surface, and wherein said second part has a second mounting surface and a second parting surface, and wherein said first and second parting surfaces are intended to seal at a sealing surface when said mold is closed, to prevent flash during molding, wherein said sealing surface defines a reference surface;

first attachment means having a predetermined length located between said first mounting surface and said first attachment surface for joining said first mounting surface and said first attachment surface;

wherein said first predetermined length varies as a function of the radius from said particular lateral position according to the relation $z_m = (C/2)[1 - \cos(\arcsin 2x/C)]$ $z_u = [(B/2) - X] \tan(\arcsin 2X/C)$, where B is the length between the centers of the peripheral posts of the longest dimension of the press, x is the distance from the center of the press (and mold) to the location of interest, [(B/2)−X] is the distance from the center of an outermost mounting block of the mold to a peripheral column centerline measured in the same direction as X, and C is the diameter of a cylindrical shape approximating the deflection of the platen. X is the actual distance of the outermost mounting block of the mold from the centerline.

4. A molding apparatus for encapsulating electronic devices comprising:
   separable mold plates adapted to receive electronic devices for encapsulation in chase portions;
   a press having a first movable platen and second fixed platen, wherein said press is adapted for clamping said mold plates together between said platens with a predetermined force, and wherein said fixed platen deflects when said mold plates are clamped together;
   mounting blocks for attaching one of said mold plates to said fixed platen;
   wherein said one mold plate and said fixed platen have a common center line;
   wherein said mounting blocks between said one mold plate and said fixed platen are mounted above said chase portions of said one mold and have constant value of the product $(S)(E/L)(z-z_o)$ above said chase portions, where S is the cross-sectional area of said mounting block, E is modulus of elasticity, L is length of the mounting block, and $z-z_o$ is the amount of the fixed platen deflection as a function of distance from the center of the platen.

5. A method of preparing an apparatus for molding plastic encapsulated electronic devices having reduced flash, comprising:
   providing a press having a first platen and a second platen;
   placing in said press a force transmitting member of predetermined shape between said platens;
   closing and clamping said press against said force transmitting member to a predetermined force required for molding;
   measuring the central deflection of said first platen in response to said predetermined force;
   calculating the deflection of said platen as a function of the distance from the center of said platen based on said measured central deflection under said predetermined force and the predetermined shape of said force transmitting exerting member;
   providing a mold with separable plates, adapted to receive the plastic;
   providing mounting blocks for attaching said separable plates of said mold to said platens, wherein the lengths of said mounting blocks installed between at least one of said separable mold plates and said first platen are adjusted to decrease as the distance of their location from the center of said platen increases by an amount corresponding to said calculated deflection versus radius; and
   attaching said separable mold plates to said platens using said mounting blocks.

6. The method of claim 5 wherein said first platen is fixed to said press by four posts and said calculating step comprises solving the following equation for different values of radial distance R from the center of said fixed platen, where z is the deflection of the fixed platen as a function of distance R, A and B are the distances between said four posts, and H is the measured deflection of the center of said fixed platen;

$$z=[(D/2)^2-R^2]^{\frac{1}{2}}-(D/2)+H, \text{ where}$$

$$D=(A^2+B^2)/4H.$$

7. The method of claim 5 wherein said first platen is fixed to said press by peripheral posts and said calculating step comprises solving the following equation for different values of distance R from the center of said fixed platen, where $$z_m=(C/2)[1-\cos(\arcsin 2x/C)]$$

$$z_u=[(B/2)-X]\tan(\arcsin 2X/C),$$

where B is the length between the centers of the peripheral posts of the longest dimension of the press, x is the distance from the center of the press (and mold) to the location of interest, $[(B/2)-X]$ is the distance from the center of an outermost mounting block of the mold to a peripheral column centerline measured in the same direction as X, and C is the diameter of a cylindrical shape approximating the deflection of the platen, and X is the actual distance of the outermost mounting block of the mold from the centerline.

8. A method of encapsulating a semiconductor device having leads extending from the encapsulated semiconductor device, comprising:
   determining deflection of a platen of a molding press when said platen is under molding pressure, the platen being for transmitting pressure to a mold;
   compensating for the deflection of the platen by positioning mounting blocks between the platen and mold, the mounting blocks nearest the center of the platen being longer than the mounting blocks further away from the center;
   positioning the electronic device and its leads in the mold;
   closing the mold;
   forcing encapsulant into the mold thereby encapsulating the semiconductor device;
   opening the mold; and
   removing the encapsulating semiconductor device from the mold.

9. A method of encapsulating a semiconductor device having leads extending from the encapsulated semiconductor device, comprising:
   determining deflection of a platen of a molding press when said platen is under molding pressure, the platen being for transmitting pressure to a mold;
   compensating for the deflection of the platen by positioning mounting blocks between the platen and mold, the mounting blocks nearest the center of the platen having a greater cross-section in a plane parallel to the platen than the mounting blocks further away from the center;
   positioning the electronic device and its leads in the mold;
   closing the mold;
   forcing encapsulant into the mold thereby encapsulating the semiconductor device;
   opening the mold; and
   removing the encapsulating semiconductor device from the mold.

10. A method for encapsulating electronic devices comprising:
   providing separable mold plates having mating surfaces and adapted to receive multiple electronic devices for encapsulation;
   providing a press having a first moveable platen and a second fixed platen, said fixed platen being held by four posts, wherein said press is adapted for clamping said mold plates together between said platens with a predetermined force;

providing mounting blocks for attaching said mold plates to said platens, wherein said mounting blocks between said mold and at least one of said platens have different lengths as a function of their distance R from the centerline of said press, wherein the differences in lengths (H−z) of said mounting blocks are determined according to the equations, $(H-z) = (D/2) - [(D/2)^2 - R^2]^{\frac{1}{2}}$, where $D = (A^2 + B^2)/4H$, where A and B are the lateral separations between said posts, and where H is the measured deflection of the center of said at least one platen when said predetermined force is applied by said press;

attaching said mold plates to said platens with the centerline of said mold substantially coincident with said centerline of said press and using said attachment blocks of different length;

opening said press to separate said mold into two parts;

placing said electronic parts to be encapsulated in a first of said mold parts;

closing said mold;

applying a clamping force to said mold in said press to seal the mating surfaces of said mold parts;

providing a plastic encapsulant material to a reservoir in said mold;

injecting said plastic encapsulant into said mold cavities surrounding said electronic parts to encapsulate them;

thereafter opening said mold and removing said encapsulated parts.

* * * * *